US00RE37308E

(19) United States
(12) Reissued Patent
Cappelletti et al.

(10) Patent Number: US RE37,308 E
(45) Date of Reissued Patent: Aug. 7, 2001

(54) EEPROM MEMORY CELL WITH A SINGLE LEVEL OF POLYSILICON PROGRAMMABLE AND ERASABLE BIT BY BIT

(75) Inventors: Paolo G. Cappelletti, Seveso; Giuseppe Corda, Saronno; Carlo Riva, Monza, all of (IT)

(73) Assignee: STMicroelectronics S.r.l., Agrate Brianza (IT)

( * ) Notice: This patent is subject to a terminal disclaimer.

(21) Appl. No.: 08/376,300

(22) Filed: Jan. 23, 1995

Related U.S. Patent Documents

Reissue of:
(64) Patent No.: 4,935,790
Issued: Jun. 19, 1990
Appl. No.: 07/136,652
Filed: Dec. 22, 1987

U.S. Applications:
(63) Continuation of application No. 08/242,803, filed on May 13, 1994, now abandoned, which is a continuation of application No. 07/901,254, filed on Jun. 19, 1992, now abandoned.

(30) Foreign Application Priority Data

Dec. 22, 1986 (IT) ..... 22800 A/86

(51) Int. Cl.[7] ..... H01L 29/788
(52) U.S. Cl. ..... 257/318; 257/315; 257/316; 257/321; 365/185
(58) Field of Search ..... 257/315, 316, 257/318, 321; 365/185.08

(56) References Cited

U.S. PATENT DOCUMENTS 4,019,197 * 4/1977 Lohstroh et al. ..... 257/318
4,037,242 * 7/1977 Gosney ..... 365/185.08
4,417,264 * 11/1983 Angle ..... 365/185.08

(List continued on next page.)

FOREIGN PATENT DOCUMENTS

0035160 * 9/1981 (EP) ..... 365/185
0054355 * 6/1982 (EP) ..... 365/185
0092488 * 6/1982 (JP) ..... 365/185

OTHER PUBLICATIONS

Hsieh et al., "Electrically Alterable Memory Cell with Independent Erase Input", IBM Technical Disclosure Bulletin, vol. 23 No. 2, Jul. 1980, pp. 661–663.*
"Bit–by–Bit Erasable EEPROM with Single Transistor Per Bit". Masuoka Conference: International Electron Devices Meeting, Washington D.C., Dec. 7–9, 1981, IEDM 81 pp. 20–23.*
"High Density Single–Poly Si Structure EEPROM with LB (Lowered Barrier Height) Oxide for VLSI's" Matsukawa et al., 1986.*
"Analysis and Modeling of Floating–Gate EEPROM Cells", Kolodny et al., IEEE Transaction on Electron Devices, vol. Ed–33, No. 6, Jun. 1986.*
Modelling of Write/Erase and Charge Retention Characteristics of Floating Gate EEPROM Devices, A. Bhattacharyya, Solid–State Electronics, vol. 27, No. 10, pp. 899–906; 1986.*
"An EEPROM for Microprocessors and Custom Logic", Cuppens et al., IEEE Journal of Solid–State Circuits, vol. SC–20, Apr. 1985.*

*Primary Examiner*—Michael B Shingleton
(74) *Attorney, Agent, or Firm*—Theodore E. Galanthay; Lisa K. Jorgenson; Dan Venglarik

(57) ABSTRACT

The cell is formed of a selection transistor, a detection transistor and a tunnel condenser. The detection Transistor has its own control gate formed with an $n^+$ diffusion which is closed and isolated from those of the other cells of the same memory.

9 Claims, 2 Drawing Sheets

Figure 1:
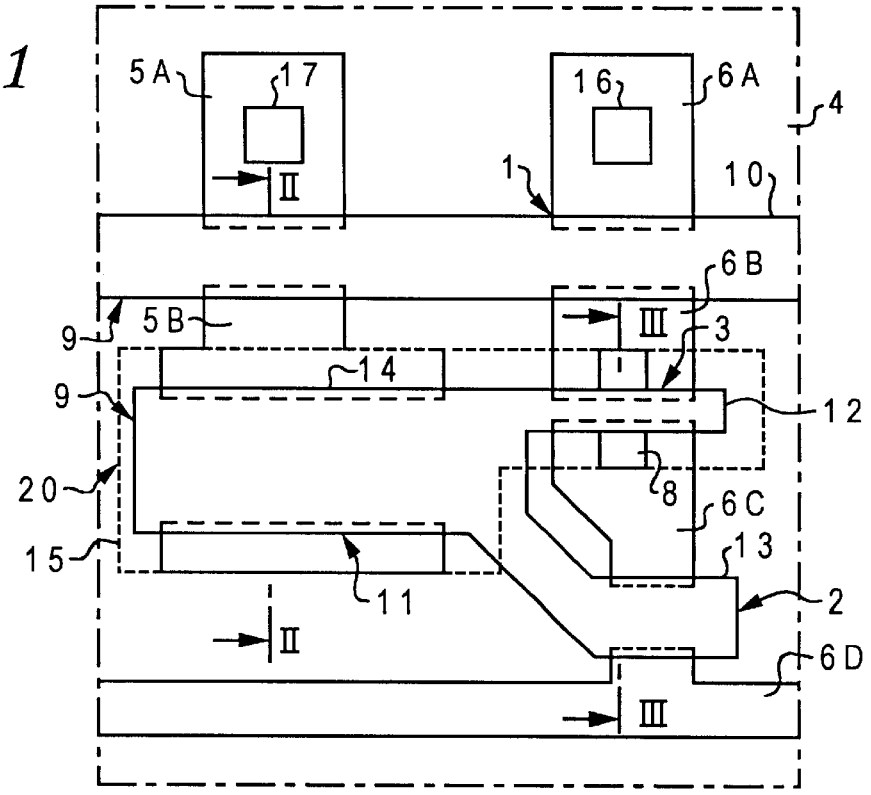

U.S. PATENT DOCUMENTS 4,425,631 * 1/1984 Adam ..... 365/185.08
4,531,203 * 7/1985 Masuoka et al. ..... 365/185.08
4,558,339 * 12/1985 Angle ..... 365/185.08
4,571,705 * 2/1986 Wada ..... 365/18.08
4,616,245 * 10/1986 Topich et al. ..... 365/185.08
4,630,087 * 12/1986 Momodomi ..... 365/185.08
4,649,520 * 3/1987 Eitan ..... 365/185.08

* cited by examiner

EEPROM MEMORY CELL WITH A SINGLE LEVEL OF POLYSILICON PROGRAMMABLE AND ERASABLE BIT BY BIT

Matter enclosed in heavy brackets [ ] appears in the original patent but forms no part of this reissue specification; matter printed in italics indicates the additions made by reissue.

*This reissue application is a continuation of reissue application Ser. No. 08/242,803, filed May 13, 1994, now abandoned, which is a continuation of reissue application Ser. No. 07/901,254, filed Jun. 19, 1992, now abandoned, which is a reissue application for the reissue of U.S. Pat. No. 4,935,790 granted Jun. 19, 1990.*

DESCRIPTION

The present invention relates to an EEPROM memory cell with a single level of polysilicon which can be programmed and erased bit by bit.

There are several references in the literature pertaining to EEPROM cells with a single level of polysilicon which are programmed and erased by Fowler-Nordheim tunneling through a thin oxide or tunnel oxide, utilizing the capacitive couplings between the control gate, the floating gate and the semiconductor substrate.

These cells comprise a selection transistor, a detection transistor and a tunnel condensor. The tunnel condenser is formed by a thin oxide zone with implantation of $n^-$ phosphorous partially superimposed on the drain diffusion of the detection transistor. A single layer of polysilicon forms the gate of the selection transistor. Separately from the gate of the selection transistor, the single layer of polysilicon forms, in a single piece, (1) an armature of the tunnel condenser, (2) the floating gate of the detection transistor, and (3) an armature of a coupling condenser of the control gate formed with an $n^+$ diffusion.

Despite the benefit represented by the simplicity of the fabrication process resulting from the use of an $n^+$ diffusion as the control gate, these known cells have the drawback of being writable by bit but erasable by line (writing being equivalent to the ejection of electrons from the floating gate and erasing being equivalent to the injection of electrons to said floating gate). This is due to the fact that the $n^+$ diffusion of the control gate is common to all the cells of a given memory line so that the cancellation order, represented by a high level of voltage applied to said n+ diffusion, is automatically and unavoidably extended to all the cells which have the $n^+$ diffusion in common, i.e. to all the cells of a given line.

Considering this state of the art, the object of the present invention is to accomplish an EEPROM memory cell with a single level of polysilicon which would be both writable and erasable by individual bits.

In accordance with the invention, the above object is achieved by an EEPROM memory cell comprising: a selection transistor, a detection transistor with a floating gate and a control gate, and a tunnel condenser. A thin oxide zone is formed using a single layer of polysilicon for the gate of the selection transistor, the floating gate of the detection transistor and the tunnel condenser and an $n^+$ diffusion is formed for the control gate. The $n^+$ diffusion is closed and isolated from that of the other cells of the same memory.

In this manner, the programming sequence applied distinctly to the $n^+$ diffusion of each individual cell allows a bit-by-bit ERASE operation. Writing is similarly possible bit by bit, performed in the conventional manner by raising the level of the gate of the selection transistor of an entire memory line with the drain contacts to ground (or floating) for all the columns except that of the selected cell.

Figure 4:
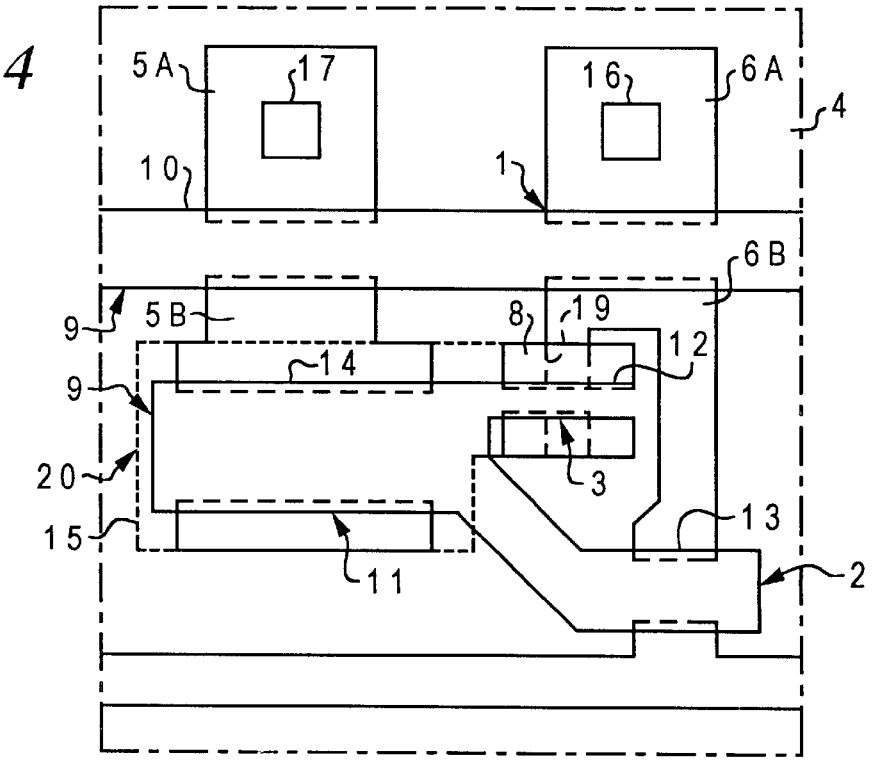
Figure 2:
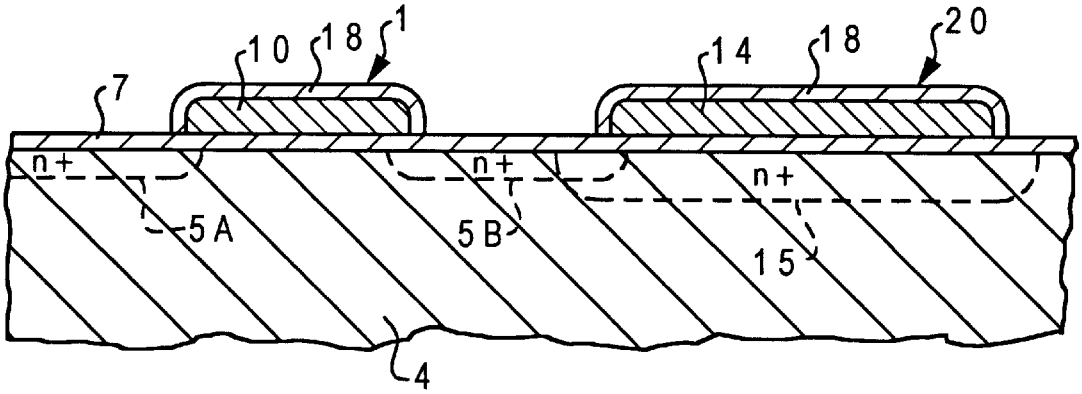
Figure 3:
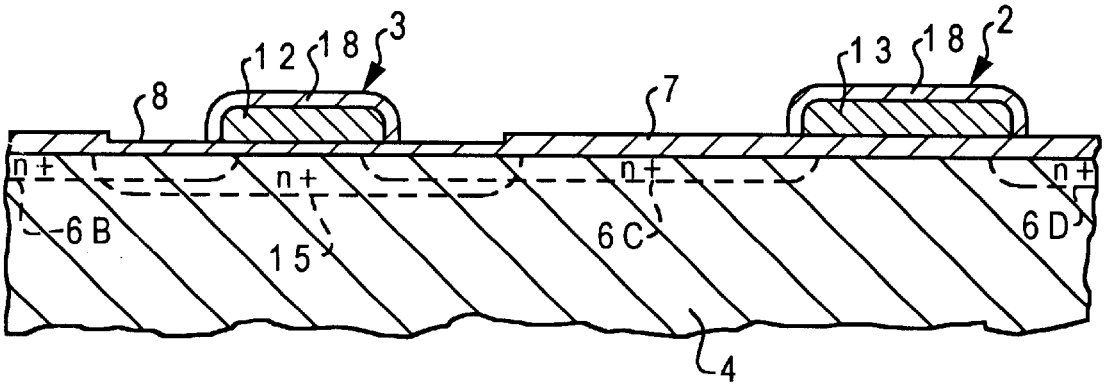

The characteristics of the present invention will be made clearer by the following detailed description of two possible embodiments illustrated as nonlimiting examples in the annexed drawings wherein:

FIG. 1 shows a schematic plan view of a first EEPROM cell with a single level of polysilicon in accordance with the present invention, FIG. 2 shows a cross section of the cell of FIG. 1 along line II—II of FIG. 1, FIG. 3 shows a cross section of the cell of FIG. 1 along line III—III of FIG. 1, and FIG. 4 shows a schematic plan view of a second EEPROM cell with a single level of polysilicon in accordance with the present invention.

With reference to FIGS. 1–3 there is shown an EEPROM memory cell in accordance with the invention which comprises a selection transistor 1, a detection transistor 2 and a tunnel condenser 3.

More specifically, on a semiconducting substrate 4 are provided a plurality of active areas with $n^+$ diffusion 5A, 5B, 6A, 6B, 6C, and 6D. A gate oxide 7 (FIGS. 2 and 3) is then grown on the active areas 6A–6D. A thin oxide zone 8 is grown on portions of active areas 6B and 6C, as shown in FIG. 3. A single polysilicon layer 9 further superimposed is formed by a straight strip 10 which forms the gate of the selection transistor 1 and by a U-part 11 which has a first branch 12 placed on the thin oxide zone 8 close to and above the active areas 6B and 6C to form the tunnel condenser 3. A second branch 13 of the U-part 11 is placed on the gate oxide 7 above portions of the active areas 6C and 6D to form the floating gate to the detection transistor 2. The U-part 11 then forms a connection space 14, partially above the active area 5B, to form, together with an underlying $n^+$ diffusion 15, the control gate 20 of the detection transistor 2. As may be seen in FIG. 1, the $n^+$ diffusion 15 is closed and isolated as regards those of the other cells of the same memory. Reference number 16 indicates a drain contact while reference number 17 indicates an output contact. Further, oxide 18 is superimposed on the layer of polysilicon 9 (FIGS. 2 and 3).

In operation, writing (i.e. the extraction of electrons from the floating gate 13 of the detection transistor 2) is performed by bringing the gate 10 of the selection transistor 1 to a high voltage level while maintaining; all the drain contacts 16 grounded (or floating), except the drain contacts of the cells of the column to which the selected cell belongs. Writing is then performed by individual bit selection.

The ERASE operation (i.e. injection of electrons to the floating gate 13 of the detection transistor 2) is, in turn, performed by bringing the gate 10 of the selection transistor 1 to a high level as well as the contact 17 of the column to which the selected cell belongs which, consequently, brings the n diffusion to a correspondingly high level. Since the n diffusion representing the control gate is closed and isolated, the ERASE operation is also performed bit by bit.

An essentially similar structure according to another embodiment of the present invention is illustrated in FIG. 4. The only difference between the first and second embodiments is the fact that the tunnel condenser 3 of the second embodiment is formed at the intersection of the polysilicon branch 12 and a branch 19 of the active area 6B where the thin oxide zone 8 is provided.

The manner of operation of the cell of FIG. 4 is identical to that already described for the cell of FIGS. 1–3.

We claim:

1. A nonvolatile semiconductor memory device with electrically selectable, erasable and programmable functions and having a plurality of memory cells arranged in a matrix form, each of said memory cells fabricated in an FET-based technology and comprising:

a detection transistor having a floating gate, a control gate, an $n^+$-doped source region, and an $n^+$-doped drain region, the floating gate partially covering the $n^+$-doped source and drain regions yet separated from at least a portion of the covered source region and a portion of the covered drain region by an oxide layer, the control gate comprising:

an $n^+$-doped diffusion region as a first conductive layer; and a second conductive layer, partially covering the $n^+$-doped diffusion region yet separated from said $n^+$-doped diffusion region by an oxide layer;

a tunnel condenser for properly defining the voltage transferred to the floating gate of said detection transistor, the tunnel condenser having a conductive layer partially covering the $n^+$-doped drain region by the detection transistor yet separated from at least a portion of the $n^+$-doped drain region of the detection transistor by a thin oxide zone; and a selection transistor for properly selecting a predetermined memory cell, the selection transistor having a gate electrode connected to the word line of the memory matrix, an $n^+$-doped source region partially covered by the conductive layer of the tunnel condenser yet separated from at least a portion of the covered $n^+$-doped source region of the selection transistor by the thin oxide zone, and an $n^+$-doped drain region connected to a bit line of the memory matrix, wherein a single layer of polysilicon is used for the gate electrode of said selection transistor, the floating gate of said detection transistor, the second conductive layer of said control gate means, and the first conductive layer of said tunnel condenser, and wherein said $n^+$-doped diffusion region representing the first conductive layer of said control gate means is at least partially contiguous with the $n^+$-doped drain region of the detection transistor and the $n^+$-doped source region of the selection transistor and is closed and isolated from the diffusion regions of the other cells of the memory matrix.

2. A nonvolatile semiconductor memory device according to claim 1, wherein the single layer of polysilicon comprises:

a straight strip portion forming the gate electrode of said selection transistor; and a U-portion including:

a first branch substantially superimposed on said $n^+$-doped diffusion region and forming the second conductive layer of said control gate means, a second branch superimposed on the thin oxide zone and forming the conductive layer of said tunnel condenser, and a third branch superimposed on said $n^+$-doped drain region of the detection transistor and forming the floating gate of said detection transistor.

3. A nonvolatile semiconductor memory device according to claim 2, further including an $n^+$-doped output region, a portion of the output region being covered by the straight strip portion, yet separated from the straight strip portion of an oxide layer.

4. A nonvolatile semiconductor memory device with electrically selectable, erasable and programmable functions and having a plurality of memory cells arranged in a matrix form, each of said memory cells formed on a p-type semiconductor substrate and fabricated in an FET-based technology and comprising:

a first $n^+$-doped active area embedded in the p-type semiconductor substrate and representing the bit line connecting all said memory cells, wherein an ohmic contact is formed in said first active area;

a second $n^+$-doped active area embedded in the p-type semiconductor substrate parallel to said first active area and representing the control gate line of a memory cell, wherein an ohmic contact is formed in said second active area;

a third $n^+$-doped active area;

a fourth $n^+$-doped active area;

a fifth $n^+$-doped active area;

a first conductive region covering portions of the first, second, third and fifth $n^+$-doped active areas, yet separated from each of the first, second, third and fifth $n^+$-doped active areas by an oxide layer;

a second conductive region covering portions of each of the fourth and fifth $n^+$-doped active regions, yet separated from each of the fourth and fifth $n^+$-doped active regions by the oxide layer, the second conductive region also covering a portion of the third $n^+$-doped active region yet separated from at least a portion of the third $n^+$-doped active region by a thin oxide zone, the first and second conductive layers being formed from a single layer of polysilicon;

a detection transistor having a floating gate, comprising a first portion of the second conductive region, and $n^+$-doped source and drain regions, comprising the fourth and third $n^+$-doped active regions, respectively;

control gate means, comprising:

an $n^+$-doped diffusion layer; and a second layer, comprising the second conductive layer superimposed on yet separated from said $n^+$-doped diffusion region by the oxide layer, wherein said $n^+$-doped diffusion layer is partially contiguous with said third and fifth active areas and is closed and isolated from the diffusion region of the other cells of the memory matrix;

a tunnel condenser for properly defining the voltage transferred to the floating gate of said detection transistor, comprising a second portion of the second conductive layer separated from at least a portion of the third active region by a thin oxide zone; and a selection transistor for properly selecting a predetermined memory cell, including:

a gate electrode, comprising a portion of the first conductive layer connected to the word line of the memory matrix, an $n^+$-doped source region comprising the third active region, and a drain region comprising the first active region.

5. A nonvolatile semiconductor memory device with electrically selectable, erasable and programmable functions and having a plurality of memory cells arranged in a matrix form, each of said memory cells being formed on a p-type semiconductor substrate and fabricated in an FET-based technology and comprising:

a first $n^+$-doped active area having first, second, third and fourth portions embedded in the p-type semiconductor substrate, the first portion representing the bit line connecting all said memory cells wherein an ohmic contact is formed;

a second $n^+$-doped active area embedded in the p-type semiconductor substrate parallel to said first active area having first and second portions embedded in the p-type substrate, the first portion representing the control gate line of a memory cell wherein an ohmic contact is formed;

a detection transistor having a floating gate, an $n^+$-doped source region belonging to the fourth portion of the first active area and an $n^+$-doped drain region belonging to the third portion of the first active area;

control gate means, comprising:

an $n^+$-doped diffusion region as a first conductive layer; and a second conductive layer separated from said $n^+$-doped diffusion region by an oxide layer, wherein said $n^+$-doped diffusion region of said control gate means is partially contiguous with the second portion of the second active area and with the second and third portions of the first active area, and is closed and isolated from the diffusion region of the other cells of the memory matrix;

a tunnel condenser for properly defining the voltage transferred to the floating gate of said detection transistor having a first conductive layer at least partially separated by a thin oxide zone from a second conductive layer, the second conductive layer being substantially formed of said $n^+$-doped diffusion region of the control gate means;

a selection transistor for properly selecting a predetermined memory cell having a gate electrode connected to the word line of the memory matrix and an $n^+$-doped drain region belonging to the first portion of the first active region and an $n^+$-doped source region belonging to the second portion of the first active region;

a single-layer of polysilicon comprising:

a first portion forming the gate electrode of said selection transistor; and a second portion comprising:

a straight strip part substantially superimposed on said $n^+$-doped diffusion region, the second portion of the first active area, and said second portion of the second active area, and forming the second conductive layer of said control gate means;

a first branch superimposed on at least a portion of the thin oxide zone and on a portion of said second and third portions of said first active area and forming the first conductive layer of said tunnel condenser; and a second branch superimposed on said third and fourth portions of said first active area, and forming the floating gate of said detection transistor.

*6. An electrically erasable, programmable nonvolatile semiconductor memory device having a plurality of memory cells arranged in a matrix, each of said memory cells comprising:*

*a control gate having a conductive region diffused in a substrate, and a conductive polysilicon layer overlying the diffused conductive region and separated therefrom by an oxide layer;*

*a detection transistor having conductive source and drain regions, and a gate formed by a first elongate arm of the conductive polysilicon layer extending from said control gate;*

*a tunnel condenser formed by a second elongate arm of the conductive polysilicon layer extending from said control gate over a portion of the drain of said detection transistor and separated therefrom by a thin oxide zone; and*

*a selection transistor having a conductive source region connected to the drain of said detection transistor, a conductive drain region connected to a bit line, and a gate connected to a word line;*

*wherein a single polysilicon layer is used to form the conductive polysilicon portion of said control gate, the first and second portion extending from the control gate polysilicon layer, and the gate of said selection transistor, and wherein the conductive region of said control gate diffused in the substrate is closed and isolated from diffusion regions of the other cells of the memory matrix.*

*7. The device of claim 6, wherein the second portion of the conductive polysilicon layer extends over the connection between the detection transistor drain region and the selection transistor source region.*

*8. The device of claim 6, wherein the selection transistor source has a first branch connected to the detection transistor drain region to define a second diffused region in the substrate, and further comprising a second branch of the second diffused region in the substrate, wherein the thin oxide zone is formed over such second branch.*

*9. The device of claim 6, wherein all of the conductive regions in the substrate, and the conductive polysilicon layer, are doped n-type.*

* * * * *